United States Patent [19]

Ahmed

[11] Patent Number: 4,468,283

[45] Date of Patent: Aug. 28, 1984

[54] METHOD FOR ETCHING AND CONTROLLED CHEMICAL VAPOR DEPOSITION

[76] Inventor: Irfan Ahmed, 31 Bradford Rd., Framingham, Mass. 01701

[21] Appl. No.: 451,450

[22] Filed: Dec. 17, 1982

[51] Int. Cl.³ ............... H01L 21/306; H01L 7/36; B05D 5/12; C23C 11/00
[52] U.S. Cl. .................. 156/642; 118/728; 148/175; 156/611; 156/612; 156/613; 156/345; 156/646; 156/662; 156/DIG. 111; 427/87; 427/255.1; 427/309
[58] Field of Search ............ 156/345, 643, 646, 642, 156/610–614, DIG. 111; 204/192 E, 298; 148/175; 427/38, 39, 87, 248.1, 255.1, 255.2, 255.3, 255.7, 309; 118/715, 724, 733, 728

[56] References Cited

U.S. PATENT DOCUMENTS

| | | | |
|---|---|---|---|
| 3,522,118 | 7/1970 | Taylor et al. | 156/646 |
| 3,721,583 | 3/1973 | Blakeslee | 148/175 X |
| 3,916,034 | 10/1975 | Tsuchimoto | 156/614 X |
| 4,095,004 | 6/1978 | Fraas et al. | 156/613 X |
| 4,401,507 | 8/1983 | Engle | 156/345 |

*Primary Examiner*—William A. Powell
*Attorney, Agent, or Firm*—Schiller & Pandiscio

[57] ABSTRACT

A high velocity stream of gas comprising of either the carrier gas or one or more film forming or removing components is shot through a shooting means such as a nozzle or orifice in the form of a high speed stream of gas in a chemical vapor deposition growth chamber or within an attachment receiving reaction gases from such a chamber. This gas or mixture of gases entrains all of the adjacent gases within the vicinity of the shooting nozzle or orifice and is subsequently swept through a diffusion tube. The diffusion tube compresses and exhausts the gas mixture at a pressure sufficient to drive the combined gas mixture through a heat exchanger and finally back into the growth chamber. The gases within the growth chamber are provided for entrainment downstream to a heated base or substrate which is being coated with a thin film or epitaxial layer of film forming components contained in a carrier gas. The entrained temperature adjusted gas mixture together with the high velocity gas mixture is reintroduced upstream of the same heated base or substrates in the growth chamber.

19 Claims, 3 Drawing Figures

4,468,283

METHOD FOR ETCHING AND CONTROLLED CHEMICAL VAPOR DEPOSITION

BACKGROUND OF THE INVENTION

The introduction of optical fibres in the field of communication and the need for very large scale integration within the integrated circuits industry together with recent developments leading towards the fabrication of novel electronic devices has created a demand for thin epitaxial films of compound semiconductors. Some of these are the binarys GaAs, and InP, the ternarys CdHgTe, GaInAs, GaAlAs and GaInP and the quaternarys like GaInAsP. Growth of thin epitaxial films of these and other compound semiconductors is presently been carried out by various techniques such as liquid phase epitaxy (LPE) Molecular beam epitaxy (MBE) and chemical vapour deposition (CVD).

Deposition from the vapour phase is in most cases the preferred technique since it can be conveniently scaled-up to grow on large area substrates, including growth on multiple substrates. Also it offers maximum control of material properties such as thickness and composition. Another practical advantage is that it does not involve the contacting of the growing surface with a liquid or solid phase thus avoiding numerous potential problems during and after the growth process.

However the production of device quality films of compound semiconductors demands achieving uniformity of composition, crystal structure and electrical properties during growth. In addition the commercial viability of fabricated devices based on compound semiconductors depends on the reproducible availability of such films.

In the growth of reproducible, reliable and effective films the growth environment is as important as the process being used i.e. there is a key link between the growth environment and the growing film. The degree of effective homogeneity in terms of reactant partial pressures, temperatures and contact times largely determines the quality of the film produced. It is this parameter of the growth process that the present method is designed to aid significantly. The method enhances the degree of homogeneity by utilising a highly efficient means of intermixing high purity reactants within processing constraints while maintaining the integrity of the high purity reactants. At the same time the method developed provides additional features which are essential for the reproducible growth of high quality films.

PRIOR ART

Vapour phase growth of epitaxial films is a well established technology of great commercial importance to the semiconductor industry. The processes are of the open flow tube type and are generally referred to as the hydride, chloride or organometallic techniques depending upon the category of starting materials. Typically, epitaxial growth occurs in one of these systems as a carrier gas laden with reactants enters a heated region where the substrates are located. Within this region chemical reactions take place to produce the desired solid phase which is deposited upon the substrate as an epitaxial layer or film. Semiconductor films require extremely high levels of purity. Thus in comparison with most other types of crystal growth, semiconductor epitaxy generally takes place under conditions where the effects of impurities on the growth rate, crystal habit, etc are at a minimum. The substrates are heated by any one of a number of different heating methods including:

1. Indirect and direct electrical resistance heating
2. High frequency heating
3. Electron beam heating
4. Plasma heating
5. Radiation imaging or focusing Various reactor configurations are employed for vapour phase epitaxy. Some of these include the r f heated horizontal cold wall, vertical pancake cold wall, the barrel cold wall and the vertical hot wall reactors.

Attempts to improve the quality of the deposited film and the rate of deposition have involved various approaches including tighter control over temperatures as well as reactant concentrations and methods of adjusting the flow patterns within the growth chamber for enhancing the turbulance nature of fluid dynamics. All these approaches together with various others including isolation of process steps have failed to provide the desired degree of control over the growth process for obtaining device quality films on a reproducible basis.

Recycling of process streams is a very basic and fundamental technique in chemical processing industry which is generally employed in chemical reactors or process units for achieving a higher degree of mixing and control by enhancing homogeneity in the reaction vessel. However this is generally achieved by utilizing either pumps or compressors. These equipments are mechanical in nature with moving parts which often require lubricants or working fluids for normal operation. The use of vacuum pumps or compressors for recycling gaseous streams within a chemical vapour deposition process increases the likelihood of contaminating these highly pure streams with the lubricants or working fluids employed in these equipments and is thus unattractive.

SUMMARY OF THE INVENTION

It is therefore an object of this invention to provide a new and improved recycle method which maintains the integrity of the high purity vapours and is capable of promoting uniform growth rates of epitaxial or thin films by chemical vapour deposition. It is another object of this invention to further improve product uniformity in a open tube epitaxial growth system by the reduction of temperature and concentration gradients of the reactants. It is still another object of this invention to provide an effective means of reducing the depletion reactions between reactants thus providing precise control of the quality of the grown film or epitaxial layer.

These and other objectives are accomplished within the broad aspects of the present invention by providing a new and improved method for the suction and subsequent recycle of the high purity gases down stream of the deposition region to the up stream section of the growth chamber. The invention provides the ability for increasing contact time by adjusting the rate of recycle. The recycling of the high purity vapour is accomplished by utilizing the scientific principles employed in the design of simple air ejectors. This is based on a high pressure stream of carrier gas, vaporized reactant, or a mixture of carrier gas and vaporized reactants entering a small orifice nozzle and issuing into a suction head as a high velocity jet. This jet entrains all of the adjacent gases and sweeps them into a diffuser tube. Here they are compressed and exhausted at a controlled pressure into a section of the reaction chamber which is upstream of the growth region thus effectively recontacting the deposition zone. The interaction taking place between the jet stream and the entrained gases in the suction head as well as within the diffuser tube provides a highly efficient mens of intermixing the two streams. Additionally since it is possible to use only part of the reactants for ejecting the high velocity jet this can also serve as an effective means of isolating the reactants being input to the growth chamber, thus reducing any homogeneous depletion reactions that would otherwise cause difficulty in controlling the qualtiy of the growing film or epitaxial layer.

BRIEF DESCRIPTION OF THE DRAWINGS

The forgoing and other objects, features and advantages of the invention will be apparent from the following more particular description of a preferred embodiment of the invention, as illustrated in the accompanying drawings.

GENERAL DESCRIPTION

Although the method of the instant invention may generally be applicable to many vapour deposition processes, only a typical reaction will be specifically referred to. The reaction that is illustratively employed to demonstrate the preferred embodiment of the instant invention is the conversion of tri ethyl indium in the presence of phosphine to indium phosphide, described by the equation

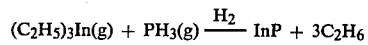

$$(C_2H_5)_3In(g) + PH_3(g) \xrightarrow{H_2} InP + 3C_2H_6$$

In reality the reaction is more complex and depends upon the homogeneous gas phase concentration of the different thermal degradation products of $PH_3$, other reactant concentrations, temperatures, pressures and reactor geometry all of which may result in the various side reactions ultimately effecting the properties of the grown film. Since the reaction essentially involves the growth of a binary compound the partial pressures of the individual components at the substrate surface primarily impact the growth rates and subsequently the morphology. However it will be apparent to those skilled in the art that the grown film quality of the higher order ternary and quaternary compounds is critically related to the partial pressures of the reactant species at the growing surface since this impacts the composition and thus the basic crystal structure and hence was major influence on the film uniformity, morphology and electrical characteristics. Additionally the removal of films or material from substrate surfaces prior to growth is often needed to improve film quality by preventing propogation of any substrate defects. This is often achieved by reversing the deposition reaction in the presence of high concentration of HCl and is often referred to as substrate etching. Thus reference to vapour deposition processes in describing the instant invention may also be considered to include any heat induced chemical vapour deposition or etching process.

DETAILED DESCRIPTION

Figure 1:
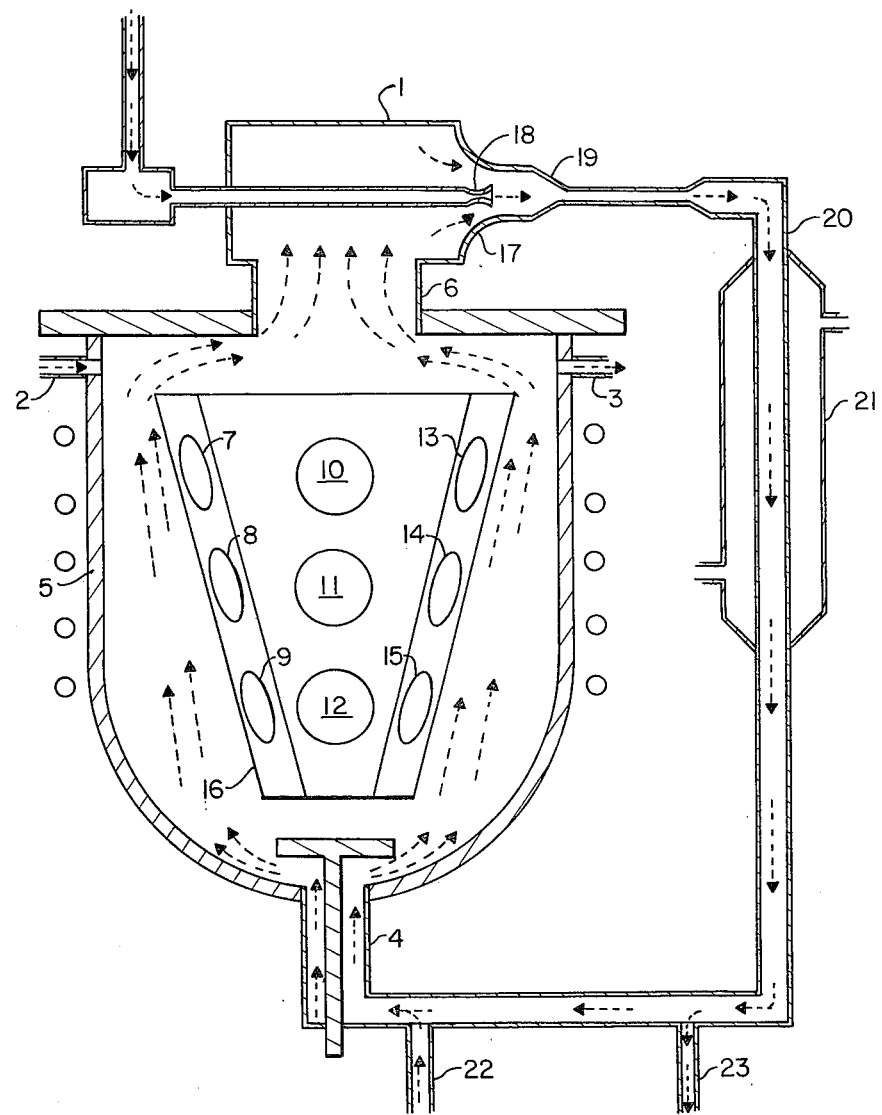
FIG. 1 is an overall schematic layout of a preferred embodiment of the instant invention.

Referring now to FIG. 1 there is shown a schematic of a preferred embodiment of the present invention. The growth reactor shown is generally termed as an upflow cold wall barrel reactor consisting of a rotating barrel substrate holder capable of handling multiple wafers at one time. The barrel is enclosed in a jacketed chamber through which cooling water is circulated by water inlet tubes 2 and water exit tubes 3. Reactant inlet tube 4 is provided to supply gases to the growth chamber 5. Exhaust gases leave the growth chamber through exhaust point 6 into the suction head 17 after passing over the substrates 7–15 being held on the rotating barrel substrate holder 16.

Before describing the operation within the suction head 17 shown here as a part of an attached vapour ejector generally designated 1, a brief description of the broad aspects of the operation of the growth chamber 5 will be provided.

The sequence of events that occur within the growth chamber 5 may be summarised by the following steps:

1. Transport of reactants to deposition region
2. Transport of reaction from main gas stream to surface region
3. Adsorption of reactants onto surface
4. Surface processes including surface reactions, surface diffusion, site incorporation etc.
5. Desorption of produgts from surface
6. Transfer of products from surface region to main gas stream
7. Transport of products away from deposition region The slowest step within these determines the overall rate of deposition. This slow step is referred to as the growth rate controlling step. The possible rate controlling steps may be grouped into two basic categories: mass transfer controlling or reaction controlling. Steps 3, 4 and 5 are classified as reaction related whereas the others are essentially mass transfer related steps. The growth of epitaxial films of high quality demands a delicate balance of various parameters influencing their growth. Prominent amongst these are the deposition rate and growth environment. In order to achieve control over these parameters it is crucial that independent control be exercised on as many of the variables influencing these parameters as possible. Control over the growth environment can basically be achieved by enhancing the degree of homogeneity within the growth chamber thus reducing the point to point variation in temperature, concentration and velocities. Such an environment provides a higher degree of control over the growth rate and thus directly promotes growth of uniform quality films.

Figure 2:
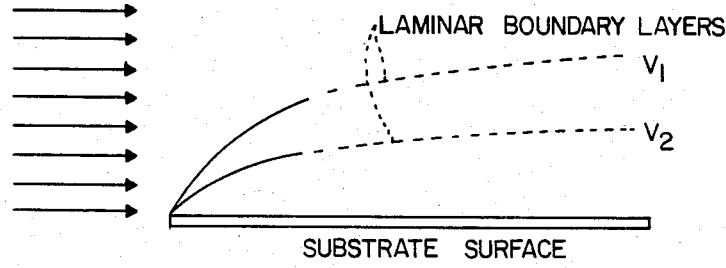
FIG. 2 is a schematic of the substrate surface qualitatively showing the boundary layer thickness variation under ideal conditions along the substrate surface for two different bulk velocities. Here the velocity $V_2$ is greater than the velocity $V_1$.

Most epitaxial growth reactors are operated in a manner that produces essentially laminar flow. Under conditions of laminar flow, mixing occurs by diffusion rather than by forced convection. Also it is the diffusion of reactants through the laminar boundary layer existing close to the substrate surface that determine the mass transfer rate of reactants to the growing film. The height of this laminar boundary layer varies along the length of the substrate surface as represented qualitatively in FIG. 2 showing the boundary layer thickness to increase along the substrate surface in the direction of flow. The overall thickness of the laminar boundary layer region decreases with higher velocities as shown in FIG. 2. Thus the effect of increased velocities tends to promote the effective rate of reactant diffusion through these layers.

Figure 3:
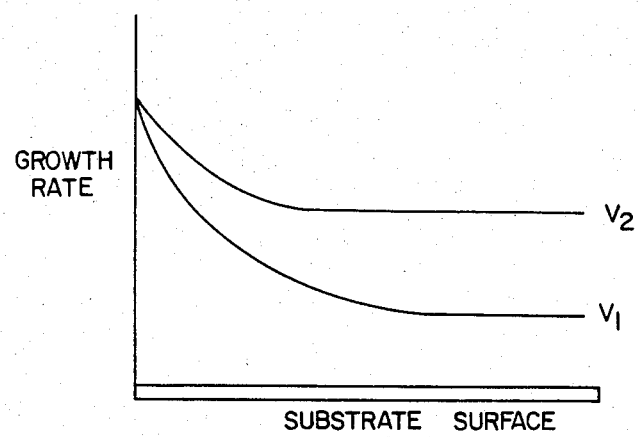
FIG. 3 is a qualitative representation of deposition growth rate along the substrate surface for diffusion limited mass transport for two different bulk velocities where the velocity $V_2$ is greater than the velocity $V_1$.

FIG. 3 is a qualitative description of the deposition growth rate along the surface of the substrate. The maximum growth rate is reaction rate controlling and occurs at the leading edge of the substrate where the boundary layer is at its minimum thickness thus resulting in high reactant diffusion rates. Also it needs to be pointed out here that for systems of once through design i.e. with no recycle this is also a point of the highest reactant concentrations and thus relatively higher reaction kinetics. After deposition begins in a once through laminar flow system the boundary layer thickness increases while the reactants concentration decreases thus lowering the reactant diffusion rates which subsequently become the deposition growth rate controlling step. It can be observed from FIG. 3 that increased velocities by lowering the overall boundary layer thickness tend to decrease the difference between the kinetic and duffusion limited growth rates along the substrate thus promoting uniformity of deposition growth rates over the surfaces of individual substrates. In addition if the bulk phase concentrations of reactants existing outside the boundary layers is controlled above a critical concentration the effect of the reactants diffusion rates on the overall deposition growth rate can be maintained above the reaction rate controlling step thus further promoting the linearity in the deposition growth curves along the substrate surface.

This can practically be achieved by controlled recycling of the fluid back into the reaction growth chamber 5, thus effectively increasing velocities within the growth chamber. Recycling at the same time also promotes uniform reaction rates at the surface due to the homogeneous reactant concentrations achieved in such a system.

It can thus be seen that the present invention is designed to provide additional control over the growth environment and deposition growth rates. Such control is crucial for growing epitaxial films of high quality.

Referring now to FIG. 1 the vapour ejector 1 is essentially being employed as a high purity vapour pump. It recycles the vapour being exhausted from the growth chamber 5 at the point 6 finally delivering it back through the chamber inlet tubes 4. The recycling is accomplished with the aid of high pressure energy of a motive fluid. The motive fluid in this case is a high purity vapour mixture of reactants necessary for the growth of the epitaxial film within the growth chamber 5. This motive fluid enters the nozzle 18 and issues into the suction head 17 as a high velocity jet. The jet entrains all of the adjacent gases which results in intimate mixing of the motive fluid and the entrained gases due to the high velocity turbulent flow present. This mixture is then swept into a diffusion tube 19. Here they are compressed and exhausted at the pressure in the discharge line 20. The discharge line 20 is equipped with a means of heat removal or heat input as needed for the specific growth process by means of an appropriate heat exchanger 21, thus providing an additional control variable. This temperature adjusted mixture is then delivered to the growth chamber inlet tubes 4. Other fresh reactants are introduced either separately at an appropriate point within the recycle line as shown in FIG. 1 at 22 or through an independent inlet within the growth chamber. Similarly the exhaust stream from the integrated growth process can be discharged either at an appropriate point within the recycle line as shown in FIG. 1 at 23, or through an independent outlet within the growth chamber.

It can thus be seen that the use of the vapour ejector results in two additional independent control parameters of the epitaxial growth process. These are the recycle rate that impacts contact times and the laminar boundary layer thickness thus influencing the deposition growth rate and efficiency of the overall process. The other is the heat transfer capacity that impacts the relative concentrations of products resulting from homogeneous cracking of reactants due to high temperatures thus influencing the partial pressures of chemical species and thereby the growth environment.

In addition the resultant high degree of mixing provides a degree of control over depletion reactions between reactant species by lowering the tendency towards localized concentrations of reactants species involved in such reactions. It should also be noted that the use of only some reactant species as motive fluids within the ejector where these are intimately mixed with a large volume of the growth chamber exhaust stream also reduces localized high concentrations of these reactant species within the growth system and thus their participation in such depletion reactions.

With reference to the typical reaction indicated in the general description. The introduction of $PH_3$ (g) and $H_2$ mixture of high purity as the motive fluid and the high purity tri ethylindium $H_2$ mixture as the independently introduced reactant to the deposition growth chamber represents a typical application of the present invention. For an epitaxial film of InP generally the substrate are misoriented from a singular or low index surface of an InP single crystal. For those skilled in the art it will be apparent that the invention provides an effective means of controlling the depletion reaction between triethylindium and phosphine. Also it will be apparent to these that the adjustment of temperatures in the recycle line 20 by means of the heat exchanger 21 of the input $PH_3$ together with the increased time for the phosphine cracking reactions resulting from the additional volume within the added equipment to the deposition growth chamber results in control over the concentration of the phosphorous containing species.

While the invention has been particularly shown and described with reference to a preferred embodiment thereof, it is recognized that departures may be made towards applications other than growth of compound semiconductors such as deposition of thin films and coatings in general which are within the scope of the inventions and that obvious modifications will occur to one skilled in the art. It will also be understood by those skilled in the art that various changes in the form and details may be made therein without departing from the spirit and scope of the invention.

What is claimed is:

1. A method of producing a film on a surface of an article through a chemical reaction of film forming components contained in a gas contacted with said surface in a reaction chamber which comprises:
   forming a high velocity stream of a gas comprising at least one film forming component by shooting said gas through a jetting means in the form of a high speed stream of gas on the downstream side of said chamber.

2. A method of removing a thin film from the surface of a substrate through a chemical reaction of film removing components contained in a gas contacted with the substrate surface in a reaction zone which comprises: forming a high velocity stream of gas comprising one or more film removing components by shooting said gas through a jetting means in the form of a high speed gas stream on the down stream side of said reaction zone.

3. Method according to claim 2 in which the high velocity stream of gas is re-introduced to said reaction zone.

4. Method according to claim 2 in which the high velocity stream of gas is sent through a diffuser tube for the purpose of converting its energy form from a velocity head to a pressure head.

5. Method according to claim 3 in which the temperature of the high velocity stream is changed prior to reintroduction into said zone.

6. An improved method of accomplishing chemical vapor deposition or etching of a selected material on a substrate by exposing said substrate to one or more components of a selected gas in a reaction chamber, wherein the improvement comprises removing said gas from said reaction chamber, and recycling said gas to said reaction chamber simultaneously with flow of an additional quantity of said one or more components into said reaction chamber.

7. An improved method according to claim 6 including the step of forming a high velocity stream of said removed gas before said removed gas is recycled to said reaction chamber.

8. An improved method according to claim 7 wherein said high velocity stream is produced by directing said removed gas to a gas ejector means where it is entrained in a high velocity jet of a carrier gas.

9. An improved method according to claim 8 wherein said carrier gas comprises one or more components of said selected gas.

10. An improved method according to claim 6 wherein said removed gas is subjected to heat exchange before it is recycled to said zone.

11. An improved method according to claim 6 wherein said reaction chamber is a vapor deposition chamber.

12. A method of improving the homogeneity of films produced by chemical vapor deposition on substrates in a selected reaction zone comprising the steps of:
   (a) placing said substrates in said selected reaction zone;
   (b) introducing at least one film-forming reactant in gaseous form to said reaction zone so as to induce chemical vapor deposition of a film on each of said substrates;
   (c) removing excess gaseous film-forming reactant(s) from said reaction zone by means of a suction force created by a jet stream of a carrier gas, and
   (d) recycling at least part of said excess gaseous film-forming reactant(s) to said reaction zone together with said carrier gas.

13. A method according to claim 12 wherein said carrier gas comprises a film-forming reactant.

14. A method according to claim 12 further including the step of injecting additional film-forming reactant into said zone simultaneously with said recycling.

15. A method according to claim 12 wherein two or more film-forming reactants are introduced to said reaction zone.

16. A method according to claim 12 further wherein said excess film-forming reactant(s) and said carrier gas are subjected to the influence of a heat exchanger before being recycled to said reaction zone.

17. A method according to claim 12 further including the step of purging part of said excess film-forming reactant(s).

18. A method according to claim 12 wherein said at least one film-forming reactant is selected so as to form an epitaxial film on said substrate.

19. A method according to claim 12 wherein said reaction zone comprises a heated chamber.

* * * * *